Jan. 5, 1954

G. H. HADDEN 2,665,379

FREQUENCY DIVIDER

Filed Sept. 8, 1950

INVENTOR
GEORGE H. HADDEN

By Semmes, Keegin, Robinson & Semmes
ATTORNEYS

Patented Jan. 5, 1954

2,665,379

UNITED STATES PATENT OFFICE 2,665,379

FREQUENCY DIVIDER

George H. Hadden, Brattleboro, Vt., assignor to Minshall-Estey Organ, Inc., Brattleboro, Vt., a corporation of Vermont Application September 8, 1950, Serial No. 183,866

9 Claims. (Cl. 250—27)

This invention relates to frequency dividers of electrical oscillations in general. More particularly this invention relates to electrical frequency dividers adapted for use in electrical musical instruments.

An object of this invention is to provide an improved frequency divider employing a single thermionic tube or semi-conductor amplifier.

Another object of this invention is to provide a frequency divider of improved non-oscillating type that produces no signal or waveform in the output circuit unless the appropriate signal is applied to its input circuit.

Still another object of this invention is to provide a frequency divider circuit that will operate satisfactorily over a relatively large range of frequencies.

A further object of this invention is to provide a frequency divider of high stability that is free from erratic modes of operation and influences by radiation phenomena.

A further object of this invention is to provide a frequency divider employing a plurality of stages of dividers all of which are free from back coupling of interfering signal developed by succeeding dividers to output circuits of preceding dividers.

Still another object of this invention is to provide a frequency divider that produces a sawtooth waveform in its output.

Another object of this invention is to provide a frequency divider arranged so that conduction or partial conduction on undesired pulses does not destroy its dividing properties.

Another object of this invention is to provide a cascade frequency divider circuit that will operate satisfactorily with an input signal consisting of a small fraction, in amplitude, of the sawtooth waveform developed in the anode circuit of a preceding divider, said cascading being possible over a number of stages.

Still another object of this invention is to provide a frequency divider that will continue to function as a divider even though the input signal goes through relatively large changes in amplitude and in which the output waveform amplitude is independent of any such changes in input signal amplitude.

Other and further objects of this invention will be apparent to those skilled in the art to which it relates from the following specification, claims and drawing.

In accordance with this invention there is provided a thermionic vacuum tube circuit for the purpose of dividing the frequency of electrical oscillations supplied to it and for the purpose of producing sawtooth oscillations corresponding to the divided frequency. The process of dividing the frequency of a periodic signal requires that plate-cathode conduction of the thermionic tube occasioned by applied signal pulses be confined in whole or in part to every other or to selected incoming pulses. As in the conventional voltage amplifier the total peak to peak value of voltage developed in the plate-cathode circuit waveform is considerably larger than the total peak to peak value of voltage applied to the grid-cathode circuit. In other words, some voltage amplification or gain is obtained. Normally, if a conducting path occasioning little or no phase-shift or time delay were connected between plate-cathode circuit and grid-cathode circuit a loss in overall gain would be the only result. This would be due to the 180° phase-inversion which normally takes place in the plate-cathode circuit of a normal voltage amplifier. This constitutes negative feedback of a greater or less percentage depending upon the relative conductivity of the aforementioned path between plate and grid circuits, and the stage gain of the tube. If, however, the aforementioned path takes the form of an integrating phase-shift network two highly significant effects are obtained. In the first place the integrating characteristic of the said path attenuates the higher frequency components that may be present to a greater or lesser degree in the plate-cathode circuit waveform. Secondly, the phase-shift characteristics of the said path retard the phase of the residual sine wave fundamental. It is expressly observed at this point that the said fundamental component at the anode lags by approximately 90°, the tube current occasioned by the effective input signal peak. This is caused by the non-linear operating characteristics of the tube in conjunction with a capacitive plate load. This residual fundamental constitutes, in effect, a periodically varying reference level in the grid-cathode circuit upon which said reference level the signal waveform which it is desired to divide is superimposed. The resultant composite waveform now present at the grid-cathode circuit is of such configuration as to cause plate-current flow at periods equal to a submultiple of the period of applied signal waveform. The phase-shift network can be designed to occasion a phase-shift approaching the optimum of 90° without excessive attenuation. This is dependent to some extent on tube type and plate-circuit component proportions. The phase-shift network may consist of a simple capacitor-resistor combination (R–jX) having proportions providing a phase-delay approaching 90° without excessive attenuation. R–jX should constitute a relatively high impedance at the center design frequency. In any event, the total phase shift of the output circuit fundamental component, as applied to the control grid, must by nature be confined to an amount less than 180 degrees. It follows that this divider circuit is absolutely incapable of self-sustained oscillations under any conditions of operation, and particularly without requiring the provision of a critical intentional loss as is needed in so-called suppressed oscillatory dividers. Within this restriction, those skilled in the art will readily be able to visualize various modifications in the feedback network capable of producing a phase shift of something less than 180° at any frequency. A complete embodiment of this invention, in the form of a multioctave electronic organ has been assembled employing a divider circuit having as the said phase-shift network a simple resistor-capacitor combination, i. e., one resistor and one capacitor, and is operating in a highly satisfactory manner. Further details of this invention will be set forth in the following paragraphs of this specification, the claims and the drawing.

Referring to the drawing briefly:

Figures 1, 2:
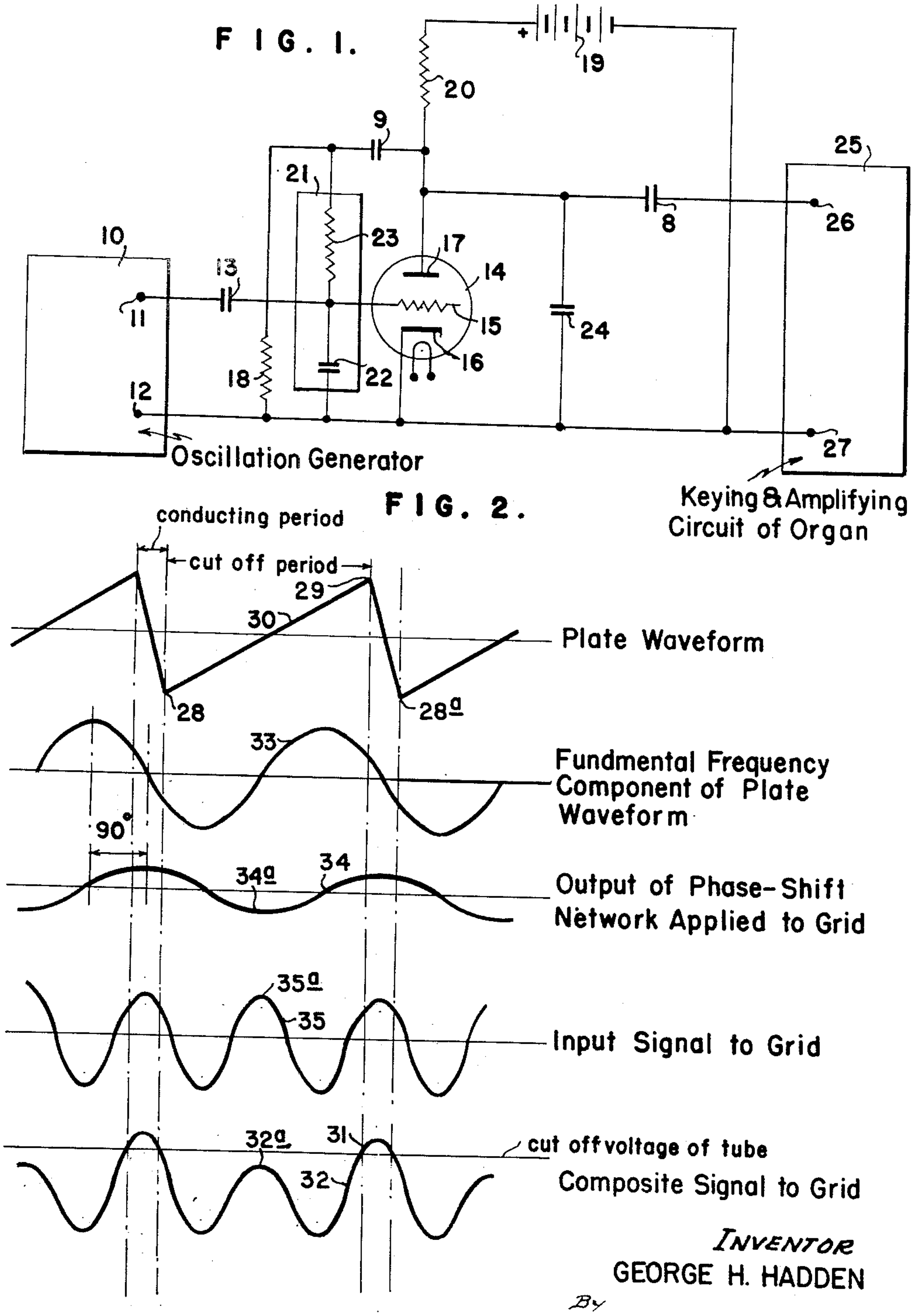
Figure 1 is a schematic wiring diagram of an embodiment of this invention.
Figure 2 is a graph illustrating a group of waveforms employed for the purpose of facilitating explanation of this invention.

In Figure 1 a source 10 of control oscillations the frequency of which is to be divided is shown with the output terminal 11 coupled through a coupling capacitor 13 to the grid electrode 15 of the thermionic tube 14 which may be a triode or other multi-grid tube. Said source may take the form of any master oscillator having vibrato adaptation. The output terminal 12 of the source of oscillations is connected to the cathode 16 of the thermionic tube 14. This cathode may be of the indirectly heated type if desired. The grid resistor 18 is connected between the grid 15 and the cathode 16 of the tube 14. Said grid-resistor, 18, may be returned to a suitable source of potential negative with respect to the cathode, 16, if tube characteristics and circuit parameters so require. The anode 17 of the tube 14 is connected to the positive terminal of the source of current supply through anode load resistor 20 and the negative terminal of this supply is connected to the cathode 16 of the tube 14. This source of current supply may be of any desired form such as, a properly rectified and filtered alternating current source or it may be a battery having the desired voltage.

A phase shifting negative feedback network 21 consisting of a capacitor 22 and a resistor 23 is connected between the anode to cathode circuit and the grid to cathode circuit of the tube 14. The integrating characteristics of this negative feedback path are such that this path attenuates the high frequency components present in the anode circuit waveform and therefore does not feed these components back to the grid circuit. The phase shifting characteristics of this negative feedback path are such as to retard the phase of the residual sine wave fundamental fed back from the anode circuit of the tube to the grid circuit. These network characteristics will be described in further detail hereinafter. The capacitor 9 is merely a D. C. blocking capacitor having negligible reactance at the frequencies involved. A similar capacitor 8 is connected between anode 17 and load circuit terminal 26.

The capacitor 24 is connected with one side thereof to the anode 17 of the tube 14 and with the other side thereof to the cathode 16 of this tube. This capacitor is also connected across the input terminals 26 and 27 of the output circuit 25 which may consist of the various keying, amplifying and reproducing circuits of an electric organ.

The capacitor 24 is also connected to be charged from the source of current supply 19 through the resistor 20 at a relatively constant rate during the portion of the cycle when the internal impedance of the tube 14 is relatively high, that is, during the time interval between the cusp 28 and the peak 29 of the sawtooth wave 30 shown in Figure 2. Thus, the capacitor 24 is charged in a linear fashion from the low voltage value represented by the cusp 28 to the peak value represented by the point 29. At the point 29 the tube 14 is rendered conductive, that is, the crest 31 of the composite signal voltage wave 32, shown at the bottom of Figure 2, is applied to the grid of the tube 14. During the interval of this voltage crest 31 between the vertical broken lines the internal impedance of the tube 14 is reduced to such an extent that the charge of the capacitor 24 flows therethrough and the potential of this capacitor is reduced from the peak value 29 to the cusp value 28*a*.

The curve 33 of Figure 2 represents the sine wave fundamental frequency component of the sawtooth wave 30 existing in the anode circuit of the tube 14. It should be noted that the phase of waveform 33 is retarded by approximately 90° relative to the peak 31 of the waveform 32. The phase of the wave 33 is retarded by an additional amount approaching 90° by the network 21 and the output of this phase shifting network 21 is fed back to the grid 15 of the tube 14. The output of the phase shifting network 21 applied to the grid 15 is represented by the curve 34.

The curve 35 represents the sine wave output of the source 10, the frequency of which is to be divided. The composite signal applied to the grid 15 consists of the wave 32 which is the sum of the waves 34 and 35, that is, the composite signal on the grid 15 is the sum of the signal supplied by the source 10 and the feedback voltage fed by the network 21 from the anode circuit of the tube 14 to the grid 15. This composite signal present at the grid-cathode circuit of the tube 14 is of such configuration as to cause plate-current to flow in the tube 14 at periods indicated by the intervals 31 of the wave 32 which periodically occur at a frequency equal to a submultiple of the frequency of the signal generated by the source 10. As pointed out previously, the phase-shift network 21 can be designed to produce a phase-shift approaching the optimum 90° without excessive attenuation. The impedance of this network 21 should constitute a relatively high impedance at the central frequency at which this network is designed to function. Alternative phase shifting networks have already been described. Thus, this network reflects upon the grid-cathode circuit an attenuated and delayed image of the fundamental frequency component of the waveform produced in the anode circuit in such a manner as to render every other positive excursion of the applied signal wave 35 ineffective. That is, the dip 34*a* of the curve 34 will reduce the crest 35a of the signal wave 35 so that the corresponding crest 32a of the composite signal 32 will be ineffective to reduce the internal impedance of the tube 14 so as to discharge the capacitor 24.

While a sinusoidal input signal is assumed such as 35, in Figure 2, this by no means implies that complex waveforms are not equally suitable. In the practical embodiment, the complex waveform output of one divider is employed as input signal for a succeeding divider. This process is repeated over the required number of stages.

This circuit may also be arranged to divide a given signal frequency by 3, 4 or more as well as multiply the signal frequency by odd or even numbers simply by changing the component values of the circuit to make it operate in a different mode.

While I have described this invention in detail with respect to a preferred embodiment, it is not desired to limit this invention to the exact detail described and shown except insofar as they may be defined in the claims.

I claim:

1. An apparatus for dividing the frequency supplied by a source of electrical oscillations comprising a source of electrical oscillations having a predetermined frequency, a non-linear amplifying device having an input circuit connected to said source and having an output circuit, means connected to the output circuit of said amplifying device for producing electrical variations having a complex waveform rich in harmonics and having a fundamental frequency that is equal to a multiple or submultiple of said predetermined frequency, a single-stage integrating network connected as an inverse feedback circuit in said amplifying device, between said output circuit and said input circuit, said network being adjusted to control the fundamental of said complex waveform variations at a frequency corresponding to a submultiple frequency of said predetermined frequency which submultiple frequency it is desired to generate, and an output load circuit for utilizing variations having said submultiple frequency.

2. An apparatus for dividing the frequency supplied by a source of electrical oscillations and for producing complex waveform oscillations corresponding to the divided frequency comprising a source of electrical oscillations having a predetermined frequency, a vacuum tube having an input circuit and an output circuit, a circuit for coupling the input circuit of said vacuum tube to the output of said source, a capacitor, a resistor and a source of current supply connected in series across said capacitor to supply the charging current of said capacitor, connections between said capacitor and said vacuum tube for discharging said capacitor through said vacuum tube, a feedback and phase shifting circuit connected to said tube to feed back a voltage from the output circuit to the input circuit thereof corresponding to the fundamental frequency of the complex waves produced by the charging and discharging of said capacitor, said feedback and phase shifting circuit being adjusted to retard the phase of said fundamental frequency voltage by substantially 90 degrees, said voltage of shifted phase being added to the voltage supplied by said source of electrical oscillations to produce a composite signal voltage for controlling the impedance of said vacuum tube at a frequency that is a submultiple of said predetermined frequency.

3. An apparatus for dividing the frequency supplied by a source of electrical oscillations and for producing complex waveform oscillations corresponding to the divided frequency, comprising a source of electrical oscillations having a predetermined frequency, a thermionic vacuum tube having a grid, a cathode and an anode, a circuit for coupling the cathode and the grid of said thermionic vacuum tube to the output of said source, a capacitor, a resistor and a source of current supply connected in series across said capacitor to supply the charging current of said capacitor, connections for discharging said capacitor through said vacuum tube, a feedback and phase shifting circuit connected to said vacuum tube to feed back a voltage from the anode circuit to the grid circuit of said vacuum tube corresponding to the fundamental frequency of the complex waves produced by the charging and discharging of said capacitor, said feedback and phase shifting circuit being adjusted to retard the phase of said fundamental frequency voltage by substantially 90 degrees, said voltage of shifted phase being added to the voltage supplied by said source of electrical oscillations to produce a composite signal voltage for controlling the impedance of said thermionic vacuum tube at a frequency different from that of said predetermined frequency.

4. An apparatus for dividing the frequency supplied by a source of electrical oscillations and for producing complex waveform oscillations corresponding to the divided frequency comprising a source of electrical oscillations having a predetermined frequency, a thermionic vacuum tube having a grid, a cathode and an anode, a circuit for coupling the cathode and the grid of said thermionic vacuum tube to the output of said source, a capacitor, a resistor and a source of current supply connected in series across said capacitor to supply the charging current of said capacitor, connections for said capacitor for discharging said capacitor through said vacuum tube, an integrating and phase shifting network connected betwen the anode and the grid of said vacuum tube, said network being adjusted to attenuate frequencies other than those desired to be fed back to the grid circuit from the anode circuit, said network being adjusted to retard the phase of voltage fed back therethrough by substantially 90 degrees, said voltage of shifted phase being added to the voltage supplied by said source of electrical oscillations to produce a composite signal voltage for periodically reducing the impedance of said thermionic vacuum tube to periodically discharge said capacitor through said tube at a frequency different from that of said predetermined frequency.

5. An apparatus for dividing the frequency supplied by a source of electrical oscillations and for producing complex waveform oscillations corresponding to the divided frequency comprising a source of electrical oscillations having a predetermined frequency, a thermionic vacuum tube having a grid, a cathode and an anode, a circuit for coupling the cathode and the grid of said thermionic vacuum tube to the output of said source, a capacitor, a resistor and a source of current supply connected in series across said capacitor to supply the charging current of said capacitor, connections for said capacitor for discharging said capacitor through said vacuum tube, a feedback and phase shifting circuit connected to said vacuum tube to feed back a voltage from the anode circuit to the grid circuit of said vacuum tube corresponding to the fundamental frequency of the complex waves produced by the charging and discharging of said capacitor, said negative feedback and phase shifting circuit being adjusted to retard the phase of said fundamental frequency voltage by substantially 90 degrees, said voltage of shifted phase being added to the voltage supplied by said source of electrical oscillations to produce a composite signal voltage for controlling the impedance of said thermionic vacuum tube at a frequency different from that of said predetermined frequency.

6. An apparatus for dividing the frequency supplied by a source of electrical oscillations and for producing complex waveform oscillations corresponding to the divided frequency comprising a source of electrical oscillations having a predetermined frequency, a thermionic vacuum tube having a grid, a cathode and an anode, a circuit for coupling the cathode and the grid of said thermionic vacuum tube to the output of said source, a capacitor connected across said thermionic vacuum tube to the cathode and anode thereof, a resistor and a source of current supply connected in series to supply the charging current of said capacitor, the value of said capacitor and the value of said resistor being such that the voltage across said capacitor gradually increases from a minimum value to a maximum value, said maximum value occurring when the potential of the grid of said thermionic vacuum tube is such as to reduce the internal impedance of said thermionic tube and discharge said capacitor through said vacuum tube, a feedback and phase shifting circuit connected to said thermionic tube to feed back a voltage from the anode circuit to the grid circuit of said thermionic tube corresponding to the fundamental frequency of the complex waves produced by the charging and discharging of said capacitor, said feedback and phase shifting circuit being adjusted to retard the phase of said fundamental frequency voltage by substantially 90 degrees, said voltage of shifted phase being added to the voltage supplied by said source of electrical oscillations to produce a composite signal voltage for controlling the impedance of said thermionic vacuum tube at a frequency different from that of said predetermined frequency.

7. In a frequency dividing circuit arrangement, a source of oscillations of determined frequency, a tube having cathode, grid and anode, said cathode and grid being respectively connected to the terminals of said source, an output load circuit connected between said cathode and said anode, a negative feedback path unit comprising a first resistor and a first capacitor connected in series, a second grid resistor connected between said cathode and the free terminal of said first resistor remote from the common point of said first resistor and said first condenser, said grid being connected to said common point of said first resistor and said first condenser, a high frequency path connection between said anode and said free terminal of said first resistor remote from said common point of said first condenser and said first resistor, said negative feedback path unit having the free terminal of its said first condenser connected to said cathode and being adapted to substantially suppress all frequencies in the anode circuit of said tube except the fundamental corresponding to the said determined frequency of said source and to retard the phase of the voltage applied to said grid from said common point of said first resistor and first condenser by substantially ninety degrees with reference to the voltage between said anode and said cathode, and a second condenser connected between said cathode and said anode.

8. A circuit arrangement according to claim 7, and a direct current source and a third resistor connected in series between said cathode and said anode with the positive terminal of said direct current source connected toward said anode.

9. A frequency-dividing circuit for producing an output wave of generally saw-tooth shape and having a fundamental frequency which is a submultiple of the fundamental of an input wave, comprising a thermionic vacuum tube amplifier having at least a cathode, an anode and a control grid, a source of anode current, a condenser and a utilization circuit all connected in parallel between the anode and cathode of said tube, a source of input waves connected between said grid and said cathode, and a feedback circuit connected between the anode-cathode path of said tube and the grid-cathode path thereof, said circuit comprising an integrating and phase-shifting network providing a phase shift of less than 180° between the output and input circuits of said tube, whereby the times of conduction of said tube are determined jointly by the input voltage and a component of the anode voltage, the component being applied to said grid-cathode path through said phase-shifting network.

GEORGE H. HADDEN.

References Cited in the file of this patent

UNITED STATES PATENTS

| Number | Name | Date |
|---|---|---|
| 2,141,343 | Campbell | Dec. 27, 1938 |
| 2,251,973 | Beale et al. | Aug. 12, 1941 |
| 2,277,000 | Bingley | Mar. 17, 1942 |
| 2,342,286 | Kock | Feb. 22, 1944 |
| 2,419,340 | Easton | Apr. 22, 1947 |
| 2,426,179 | Chatterjea et al. | Aug. 26, 1947 |
| 2,538,278 | Brown et al. | Jan. 16, 1951 |